United States Patent
Surdeanu et al.

(10) Patent No.: US 7,838,368 B2
(45) Date of Patent: Nov. 23, 2010

(54) NANOSCALE FET

(75) Inventors: Radu Surdeanu, Heverlee (BE); Prabhat Agarwal, Brussels (BE); Abraham Rudolf Balkenende, Heeze (NL); Erik P. A. M. Bakkers, Heeze (NL)

(73) Assignee: NXP B.V., Eindhoven (NL)

( * ) Notice: Subject to any disclaimer, the term of this patent is extended or adjusted under 35 U.S.C. 154(b) by 822 days.

(21) Appl. No.: 11/632,738

(22) PCT Filed: Jul. 12, 2005

(86) PCT No.: PCT/IB2005/052313

§ 371 (c)(1),
(2), (4) Date: Jan. 17, 2007

(87) PCT Pub. No.: WO2006/008703

PCT Pub. Date: Jan. 26, 2006

(65) Prior Publication Data

US 2007/0262397 A1  Nov. 15, 2007

(30) Foreign Application Priority Data

Jul. 16, 2004  (GB) ................. 0415891.1

(51) Int. Cl.
*H01L 21/336* (2006.01)
*H01L 29/775* (2006.01)

(52) U.S. Cl. .............. 438/285; 438/197; 438/962; 977/762; 977/818; 977/938

(58) Field of Classification Search .......... 257/E29.254, 257/E29.07, E51.038, E51.04, E21.404; 438/142–308, 438/197, 285, 962; 977/936–938, 818
See application file for complete search history.

(56) References Cited

U.S. PATENT DOCUMENTS

| 6,798,000 | B2 * | 9/2004 | Luyken et al. | 257/213 |
| 7,115,916 | B2 * | 10/2006 | Avouris et al. | 257/103 |
| 7,180,107 | B2 * | 2/2007 | Appenzeller et al. | 257/288 |
| 2002/0014667 | A1 * | 2/2002 | Shin et al. | 257/368 |
| 2003/0148562 | A1 | 8/2003 | Luyken |  |

FOREIGN PATENT DOCUMENTS

| GB | 2 382 718 | 6/2003 |
| WO | WO 03/083949 | 10/2003 |

OTHER PUBLICATIONS

Controlled growth and electrical properties of heterojunctions of carbon nanotubes and silicon nanowires, Jiangtao Hu, Min Ouyang, Peidong Yang & Charles M. Lieber, Nature 399, 48-51 (May 6, 1999).*

"Synthesis of InP Nanotubes" Erik P.A.M. Bakkers and Marcel A. Verheijen, J. Am. Chem. Soc., vol. 125 No. 12, 2003.*

* cited by examiner

*Primary Examiner*—Zandra Smith
*Assistant Examiner*—Eric Ward

(57) ABSTRACT

A transistor device is formed of a continuous linear nano-structure having a source region, a drain region and a channel region between the source and drain regions. The source (20) and drain (26) regions are formed of nanowire ania the channel region (24) is in the form of a nanotube. An insulated gate (32) is provided adjacent to the channel region (24) for controlling conduction i ni the channel region between the source and drain regions.

4 Claims, 3 Drawing Sheets

NANOSCALE FET

The invention relates to a nanoscale FET, and in particular to a FET using nanowire and nanotube technology.

The scaling of metal oxide semiconductor (MOS) or metal insulator semiconductor (MIS) transistor devices is reaching limits where the manufacture of planar devices meeting the targets set out in the International Technology Roadmap for Semiconductors is increasingly difficult. Therefore, new metal insulator semiconductor device architectures are emerging, such as double-gate or FinFET (fin field effect transistor) structures. However, even these devices are difficult to scale, and there are limits to the doping of the source drain regions and the thickness of the current carrying semiconductor layer under the gates.

There thus remains a need for new device types.

Very recently, a number of nanotube and nanowire FETs have been proposed.

US2003/0148562 proposes a field effect transistor with a carbon nanowire forming a source, channel and drain region and a surrounding nanotube gate. A boron nitride nanotube insulator is proposed as an insulator between the nanowire channel and the nanotube gate. However, the manufacture of such a device presents formidable manufacturing difficulties.

US2003/0178617 presents self-aligned carbon nanowire structures, mostly using vertical nanowires but including in one embodiment horizontal nanowires formed with chemical groups, on the ends and then aligned by providing complimentary chemical groups where the nanowires are to be assembled. For example, complementary strands of DNA are said to make suitable complementary groups.

US 2004/0036128 describes another carbon nano-structure, in this case using carbon nanotubes. In one embodiment, the nanotubes are grown horizontally from drain catalyst contacts.

Although the above documents describe the use of carbon nanowires, nanowires grown from semiconductor compounds are also known. An early review of methods of growing these wires and their use is provided by the applied physics review of Hiruma et al, "Growth and optical properties of nanometer-scale GaAs and InAs whiskers", in J. Appl. Phys, volume 77, number 2 (1995), pages 447 to 461.

Further details of their growth are provided in Morales and Lieber, "A laser ablation method for the synthesis of crystalline semiconductor nanowires", Science, Volume 279, pages 208 to 210, (1998).

Details of growing nanowire superlattices, i.e. nanowires containing more than one material, are contained in Gudiksen et al, "Growth of nanowire superlattice structures for nanoscale photonics and electronics", Nature, volume 415, pages 617 to 620 (2002).

The latter paper contains many more references to the so-called vapour-liquid-solid (VLS) growth process. In the VLS process, a liquid metal cluster or catalyst acts as the nucleus for growth of semiconductor from gas phase reactants. In principle, the size of the metal cluster determines the width of the nanowire. By ensuring very low diameter catalysts, narrow wires can be grown.

In the method of Morales et al, the low diameter clusters are created by laser ablation of a metal target which generates a suspension of metal clusters. The metal atoms may be for example of gold.

The paper by Gudiksen et al describes how nanowire composition may be varied during growth to provide high-quality heterostructures.

Details of the growth of nanotubes in InP is described by Bakkers and Verheijen in "Synthesis of InP Nanotubes", Journal of the American Chemical Society, Volume 125, no 12, 2003, pages 3440 to 3441.

However, there remains a need for improved semiconductor nanowire devices and practical manufacturing methods.

According to the invention there is provided a transistor device, comprising: a continuous linear nanostructure having a doped source region, a doped drain region and a channel region between the source and drain regions; and an insulated gate adjacent to the channel region for controlling conduction in the channel region between the source and drain regions. The source and drain regions are nanowires and the channel region is a nanotube extending between the source and drain regions.

In this specification, the term nanowire is reserved for solid wire nanostructures, i.e. is not used for hollow nanostructures, and the term nanotube is used for nanostructures with a hollow interior.

Precisely controlled doping of nanotubes is technically difficult and accordingly it would be very difficult to simply use a nanotube extending from a source region through a channel region to a drain region, since it would be necessary to dope the source and drain regions which in that instance would be in the form of a nanotube. In contrast, by using the approach of the invention in which a nanotube is used for the channel and a nanowire for the source and drain regions it is possible to dope the source and drain regions and still get advantages from a nanotube channel.

The nanotube channel has thin walls and accordingly will, in use, be fully inverted and this gives rise to good transistor properties. Further, the fact that the channel is fully inverted can reduce the importance of misalignment and this can improve the manufacturability of the device.

By providing a continuous nanostructure having a nanotube in the channel region and nanowires in the source and drain regions it is possible to achieve quantum confinement in the thin walls of the nanotube in the channel in preferred embodiments. This increases mobility in this region and hence improves device properties.

In preferred embodiments, the nanostructures are formed of a semiconductor material instead of carbon. Doping of semiconductors is more straightforward.

Preferably the channel nanotube region is undoped to enhance mobility of the device.

The thickness of the nanowire source and drain regions can be made larger in regions spaced away from the nanotube channel than adjacent to the nanotube channel to facilitate contacting the device, both improving manufacturability and improving the contact resistance by having a large contact area.

In a particular embodiment, the transistor is formed on a substrate having a first major surface; a plurality of said continuous nanostructures extend across the first major surface substantially parallel to one another in a longitudinal direction; a thin gate insulating layer extends laterally over the channel regions of the plurality of nanostructures; and a conductive gate material extends laterally over the thin gate insulating layer. Note that the term "substantially parallel" is not intended to imply that the nanostructures need to be exactly straight or all precisely aligned, and some variation in direction either within a single nanostructure or between different nanostructures is acceptable.

The channel region of the nanotube may be in the range 5 to 100 nm long.

The wall thickness of the channel region of the nanotube may be in the range 2 to 20 nm.

In another aspect, the invention relates to a method of manufacture of a transistor, including:

commencing growth of a nanostructure by growing a doped region in the form of a nanowire to form the source or drain;

continuing the growth of the nanostructure under changed growth conditions to grow an undoped channel region in the form of a nanotube; and continuing the growth of the nanostructure by growing a doped region in the form of a nanowire to form the other of the source or drain; and forming an insulated gate adjacent to the channel region.

The transition between the nanotube and nanowire regions may conveniently be made by varying the growth temperature. Accordingly, source and drain regions may be grown at a temperature below a predetermined transition temperature and the channel region at a temperature above the predetermined transition temperature. In the case of an InP nanotube the transition temperature may be 500° C.

The invention may include growing channel region of the nanostructure to have a first width and growing the source and drain regions to have a maximum width at least three times the first width.

In particular embodiments the method includes:

providing a substrate;

providing a plurality of catalytic starting points for growing nanostructures;

commencing growth of a nanostructure by growing doped regions in the form of a nanowire starting from the catalytic starting points, continuing the growth of the nanostructure under changed growth conditions to grow a channel region in the form of a nanotube; and continuing the growth of the nanostructure by growing a doped region in the form of a nanowire to form the other of the source or drain;

forming a dielectric layer as a gate insulator over the channel region of the nanostructures; and forming a conductive gate material over the dielectric layer.

The channel region is preferably grown undoped.

A particularly convenient method of providing a plurality of catalytic starting points includes:

depositing a plurality of thin lines of catalyst metal extending longitudinally across the substrate;

depositing an insulator over the thin lines of catalyst metal;

etching the insulator and catalyst metal in a window to exposing the ends of the thin lines of catalyst metal at the edge of the window as the catalytic starting points.

For a better understanding of the invention, an embodiment will be described, purely by way of example, with reference to the accompanying drawings, in which.

Please note that the drawings are schematic and not to scale.

Figure 1:
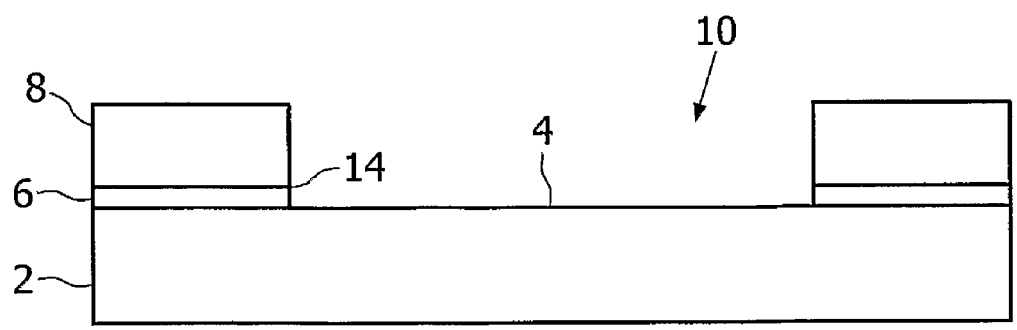
FIG. 1 illustrates a side view of first stage in the manufacture of a transistor according to an embodiment of the invention.
Figure 2:
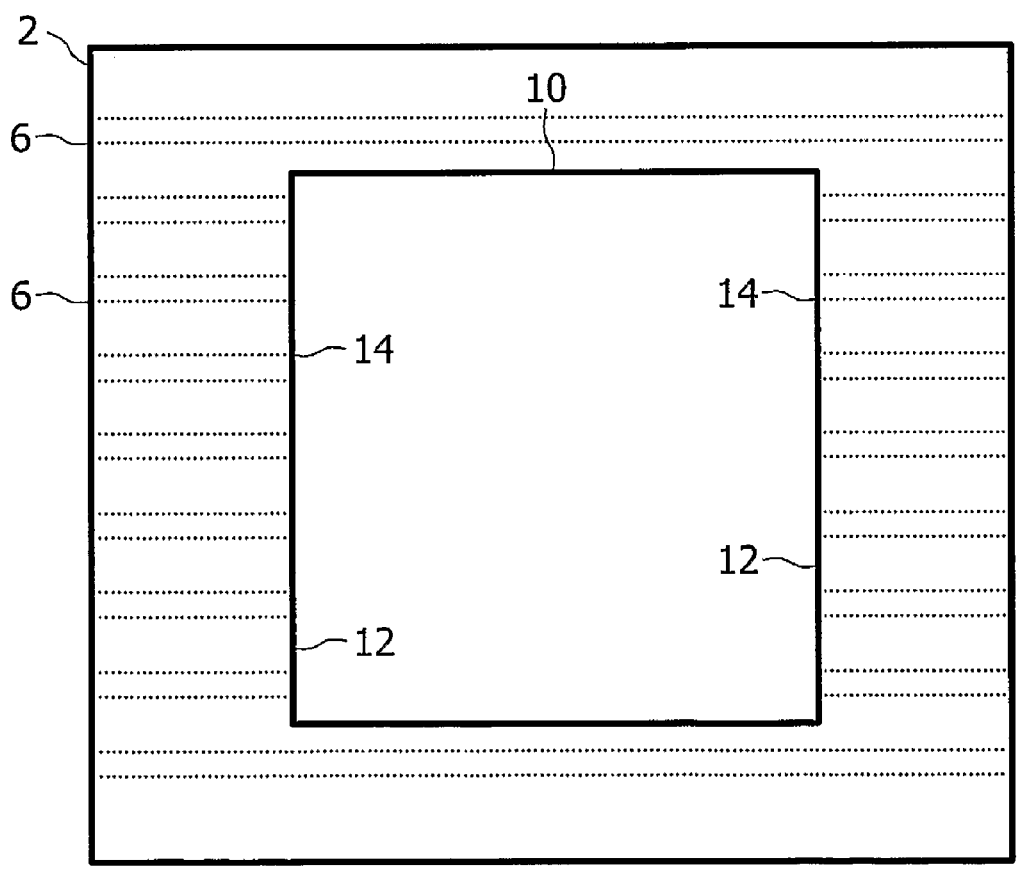
FIG. 2 is a top view of the first stage of FIG. 1.
Figure 3:
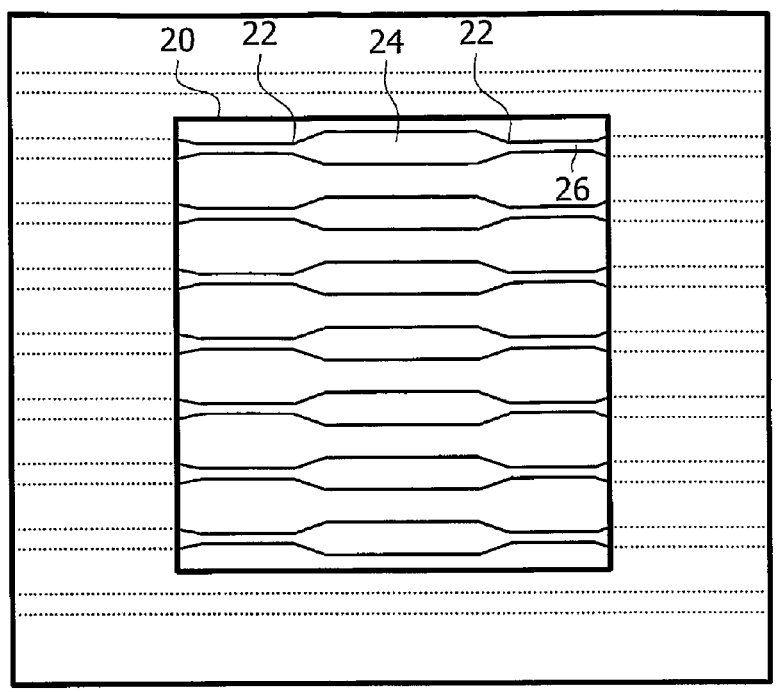
FIG. 3 is a top view of a second stage in the manufacture of a transistor according to the embodiment.

Referring to FIGS. 1 and 2, a substrate 2 is provided having a first major surface 4, shown on top in FIG. 1. A silicon substrate is widely available and convenient. Next, a thin gold layer is deposited on the substrate, and patterned to form a plurality of thin gold lines 6 running in parallel on the first major surface 4.

An oxide layer 8 is deposited over the whole surface. A window 10 is then patterned and etched through both the oxide layer 8 and the gold lines 6 to expose the substrate 2 in the window. The window 10 is conveniently square or rectangular having opposed edges 12 running perpendicular to the gold lines 6. The ends 14 of the gold lines at the opposed edges form catalytic starting points for the growth of the nanostructures.

Growth of nanostructures 18 then commences. In the specific embodiment described, InP nanostructures 18 are grown though the skilled person will be able to apply the technique to other materials as required.

The properties of nanostructures as grown depend on the growth conditions and in particular the temperature.

The initial growth is carried out using growth conditions to grow doped nanowire regions 20, without a hollow interior, of InP, and a diameter of order 20 nm. In general, such nanowire growth can be carried out at a temperature below 500° C. If required, the growth conditions can be varied to provide a tapering region 22, either over the whole of the doped nanowire regions or alternatively only after an initial section of constant width. This can provide a wider nanowire in the regions to be contacted by the source and drain contacts than in the region adjacent to the channel.

Next, the growth conditions are changed and growth continues. The dopant is removed and the temperature raised above 500° C., so that undoped nanotubes are grown to form a channel region 24. The length of the channel region may conveniently be of order 5 to 100 nm, and the width of the nanotubes of order 20 to 100 nm. The wall thickness may be 2 to 20 nm The growth conditions are then changed again and growth continued to form doped nanowire regions 26. As before, part of the region may be a tapering region 22. The second doped nanowire regions 26 can be formed using the same growth conditions as the first doped nanowire regions 20.

The changes in the growth conditions can be sufficiently abrupt to create a very abrupt boundary between the channel region 24 and surrounding doped regions 20,26, and the doping in the source and drain can also be readily controlled.

Further details of the growth conditions used for InP can be taken from Bakkers and Verheijen "Synthesis of InP Nanotubes". A VLS method may be used in which the substrate is placed on a temperature controlled alumina block and the substrate temperature stabilised. Then, a beam of an ArF laser is focussed on an InP target to vaporise InP which grows on the gold catalyst.

The transition temperature of the transition between nanowire and nanotube growth is 500° C. for undoped InP but varies a little for doped InP. For 1% Se doping, a growth temperature of 485° C. or less grows nanowires and a temperature of above 530° C. grows tubes. For 0.1% S doping, a growth temperature of 480° C. grows nanotubes. For Zn doping, a temperature of less than 480° C. grows a solid nanowire, and a temperature of greater than 515° C. grows nanotubes.

In a particular experiment, nanotubes with a wall thickness of 2 nm and a diameter or 27 nm were grown. The wall thickness of the nanotubes can be varied by varying the growth temperature above the transition temperature. In general, a higher temperature is used to grow thinner walls. For example, for an InP target doped with 0.1% S, variation of the substrate temperature from 480° C. to 550° C. resulted in the wall thickness changing from about 14 nm to 9 nm respectively.

All of these alternative nanowire growth and doping combinations may be used to grow the nanostructures of the present invention.

The skilled person will readily be able to determine by experiment suitable transition temperatures for other nanostructure materials.

Accordingly, the use of such materials is included within the scope of the invention.

Note that in the embodiment nanostructure growth will in fact commence from both opposed edges 12 of the window 10, although this is largely irrelevant in view of the symmetrical nature of the nanostructures.

Figure 4:
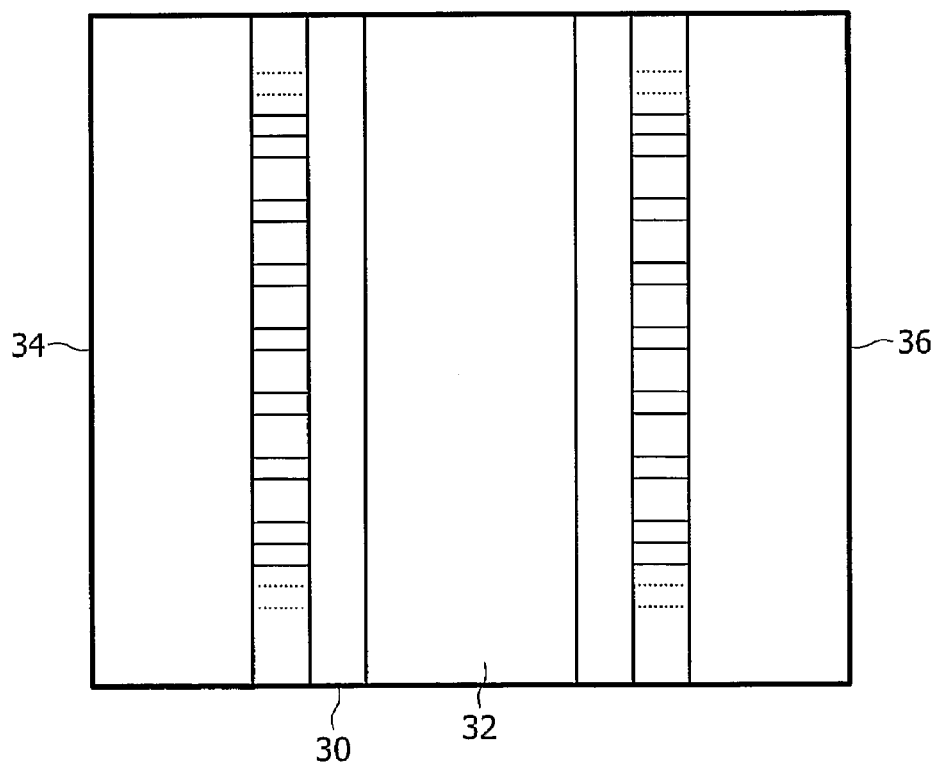
FIG. 4 is a top view of a third stage in the growth of a transistor according to the embodiment.

Referring to FIG. 4, a thin dielectric layer 30 is laid over the channel regions 24 of the nanostructures 18. In the embodiment, this is a thin layer of silicon dioxide. A gate material 32 is then deposited over the surface. In the present example, the gate material is of metal though polysilicon may also be used.

Gate 32 patterning then follows. Contacts, including source contact 34 and drain contact 36, are then made to the doped regions.

Figure 5:
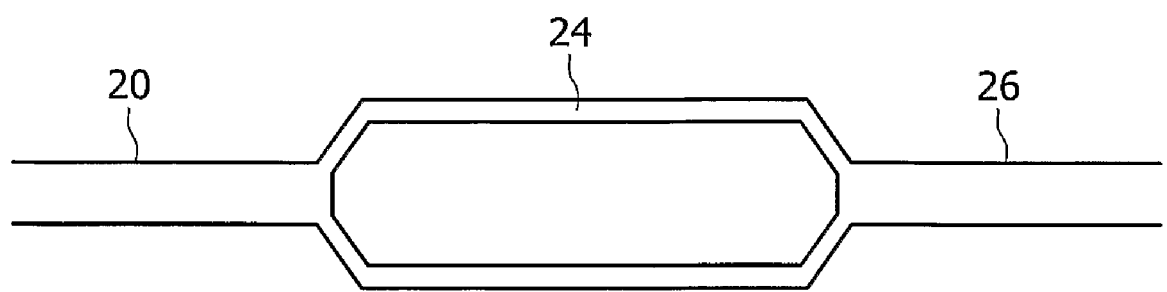
FIG. 5 is a section view of the nanostructure used in the invention.

FIG. 5 is an illustrative section view of the nanostructure formed showing the central nanotube region 24 with thin walls and the end source and drain regions 20,26 which are filled.

In view of the small size of the various components, the patterning steps may use electron beam lithography, though deep ultraviolet (DUV) or especially extreme ultraviolet (EUV) lithography may also be used.

The advantages of the device architecture include a device architecture with many degrees of freedom that can be implemented in a variety of materials, with different source drain doping and a variety of dimensions to enable the devices to be tailored to various requirements.

The whole nanostructure can be grown in a single process.

The very narrow channel region can be sufficiently small so that quantum effects increase the mobility.

The channel can be fully inverted, which can avoid problems caused by gate misalignment thereby making the device more manufacturable.

Both NMOS and PMOS devices can be manufactured in high mobility materials using the invention.

Further, the dopant activation energies and transitions can be tuned to obtain a single atom abruptness from doped regions 20, 26 to the undoped channel region 24.

From reading the present disclosure, other variations and modifications will be apparent to persons skilled in the art. Such variations and modifications may involve equivalent and other features which are already known in the design, manufacture and use of semiconductor devices and in particular nanowire and nanotubes and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

In particular, other semiconductor materials may be used instead of InP, such as Si, Ge, GaN, indeed all group III-V, II-VI and IV semiconductors, or ternary or quaternary semiconductors.

In an alternative embodiment, the gate can be deposited all around the channel regions 24 leading to improved performance.

The invention claimed is:

1. A method of manufacture of a transistor device, comprising:
   commencing growth of a nanostructure by growing a doped region in the form of a nanowire to form the source or drain;
   continuing the growth of the nanostructure under changed growth conditions to grow a channel region in the form of a nanotube;
   continuing the growth of the nanostructure by growing a doped region in the form of a nanowire to form the other of the source or drain;
   forming an insulated gate adjacent to the channel region;
   providing a substrate;
   providing a plurality of catalytic starting points for growing nanostructures;
   commencing growth of a nanostructure by growing doped regions in the form of a nanowire starting from the catalytic starting points, continuing the growth of the nanostructure under changed growth conditions to grow an undoped channel region in the form of a nanotube; and continuing the growth of the nanostructure by growing a doped region in the form of a nanowire to form the other of the source or drain;
   forming a dielectric layer as a gate insulator over the channel region of the nanostructures; and
   forming a conductive gate material over the dielectric layer.

2. A method according to claim 1 wherein the source and drain regions are grown at a temperature below a predetermined transition temperature and the channel region is grown at a higher temperature above the predetermined transition temperature.

3. A method according to claim 1 comprising growing the channel region of the nanostructure to be undoped.

4. A method according to claim 1, wherein the step of providing a plurality of catalytic starting points includes:
   depositing a plurality of thin lines of catalyst metal extending longitudinally across the substrate;
   depositing an insulator over the thin lines of catalyst metal; and
   etching the insulator and catalyst metal in a window to expose the ends of the thin lines of catalyst metal at the edge of the window as the catalytic starting points.

* * * * *